(12) United States Patent
Chidambarrao et al.

(10) Patent No.: US 6,740,920 B2
(45) Date of Patent: May 25, 2004

(54) VERTICAL MOSFET WITH HORIZONTALLY GRADED CHANNEL DOPING

(75) Inventors: Dureseti Chidambarrao, Weston, CT (US); Kil-Ho Lee, Wappingers Falls, NY (US); Jack A. Mandelman, Stormville, NY (US); Kevin McStay, Hopewell Junction, NY (US); Rajesh Rengarajan, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/096,219

(22) Filed: Mar. 11, 2002

(65) Prior Publication Data

US 2003/0168687 A1 Sep. 11, 2003

(51) Int. Cl.$^7$ .................. H01L 27/108; H01L 29/76; H01L 29/94; H01L 31/119
(52) U.S. Cl. .................. 257/302; 257/328; 257/329
(58) Field of Search ............... 257/301, 302, 257/135, 263, 264, 328, 329, 330

(56) References Cited

U.S. PATENT DOCUMENTS 6,025,224 A * 2/2000 Gall et al. ............... 438/243

6,391,705 B1 * 5/2002 Hsiao et al. ............... 438/243

OTHER PUBLICATIONS

Array Pass Transistor Design in Trench Cell for Gbit DRAM and Beyond Li, et al. VLSI Tech Sys. App. 1999, p. 251.

A Novel Trench DRAM Cell with a Verified Access Transistor and Buried Strap for 4Gb/16Gb, Gruening, et al. IEDM 1999 p. 25.

An Orthogonal 6F$^\wedge$2 Trench Sidewall Vertical Device Cell for 4Gb/16Gb DRAM Radens, et al. IEDM 2000, p. 349.

* cited by examiner

*Primary Examiner*—Long Pham
*Assistant Examiner*—Hoai Pham
(74) *Attorney, Agent, or Firm*—Eric Petraske; H. Daniel Schnurmann

(57) ABSTRACT

Body effects in vertical MOSFET transistors are considerably reduced and other device parameters are unaffected in a vertical transistor having a threshold implant with a peak at the gate and an implant concentration distribution that declines rapidly away from the gate to a plateau having a low p-well concentration value. A preferred embodiment employs two body implants—an angled implant having a peak at the gate that sets the Vt and a laterally uniform low dose implant that sets the well dopant concentration.

6 Claims, 4 Drawing Sheets

VERTICAL MOSFET WITH HORIZONTALLY GRADED CHANNEL DOPING

FIELD OF THE INVENTION

The field of the invention is the formation of vertical transistors in integrated circuit processing.

BACKGROUND OF THE INVENTION

The vertical MOSFET device is advantageous for DRAM scaling (see Li et al, Int. Symp. VLSI Tech. Sys. App. 1999, p251; Radens et al, IEDM 2000, p.349; Gruening et al, IEDM 1999, p.25), since it maintains a desired array MOSFET channel length which is independent of the minimum lithographic feature size elsewhere on the chip. This results in properly scaled array MOSFETs for minimum lithographic feature sizes below 140 nm, which would be unattainable with DRAM arrays employing planar array MOSFETs. The longer channel length of the vertical MOSFET is decoupled from the minimum lithographic feature size, thus not impacting overall density.

Referring now to FIG. 1, there is shown a portion of an integrated circuit containing a DRAM cell 80 formed in silicon substrate 10 and including a vertical transistor 100 and a deep trench capacitor 30. The arrows at the top of the Figure indicate the prior art method of making a laterally uniform implant to adjust the threshold voltage. The implant extends across the entire silicon region that forms the body of the device, so that the dopant concentration is uniform through out the body. A problem known to the art is that a change in the body substrate or p-well bias in the vertical transistor 100 produces a change in the threshold voltage Vt.

In one example, a DRAM having a nominal 110 nm groundrule had a change in Vt of 460 mV in response to a change in P-Well bias from −0.5V to −2.0V and a change of 160 mV for a change in P-well bias from −0.5V to −1.0V. This is an extremely high body effect that causes significant performance degradation for DRAM circuit operating conditions such as write-back, which require charge transfer between bitline and storage capacitor. It would be highly advantageous to find a way to design the vertical device such that the body effect is minimized, but those skilled in the art did not understand the reasons for this high bias sensitivity and consequently were not able to devise an economical solution to this problem.

SUMMARY OF THE INVENTION

The invention relates to vertical transistors having a horizontally structured threshold implant that reduces the threshold voltage's dependence on the body effect.

A feature of the invention is the placement of the peak of a Vt implant close adjacent to the gate dielectric and overlapping the channel.

Another feature of the invention is a decrease in the number of ions per cubic centimeter in the threshold implant as a function of horizontal distance from the gate dielectric.

Another feature of the invention is a vertical step in ion concentration, providing reduced junction leakage when the drain is maintained at a logic high level.

DESCRIPTION OF THE PREFERRED EMBODIMENT

The following description uses a vertical transistor that is part of a DRAM cell as an example, but that configuration is not required for the broadest use of the invention, which can be applied in a number of different circuits.

Figure 1:
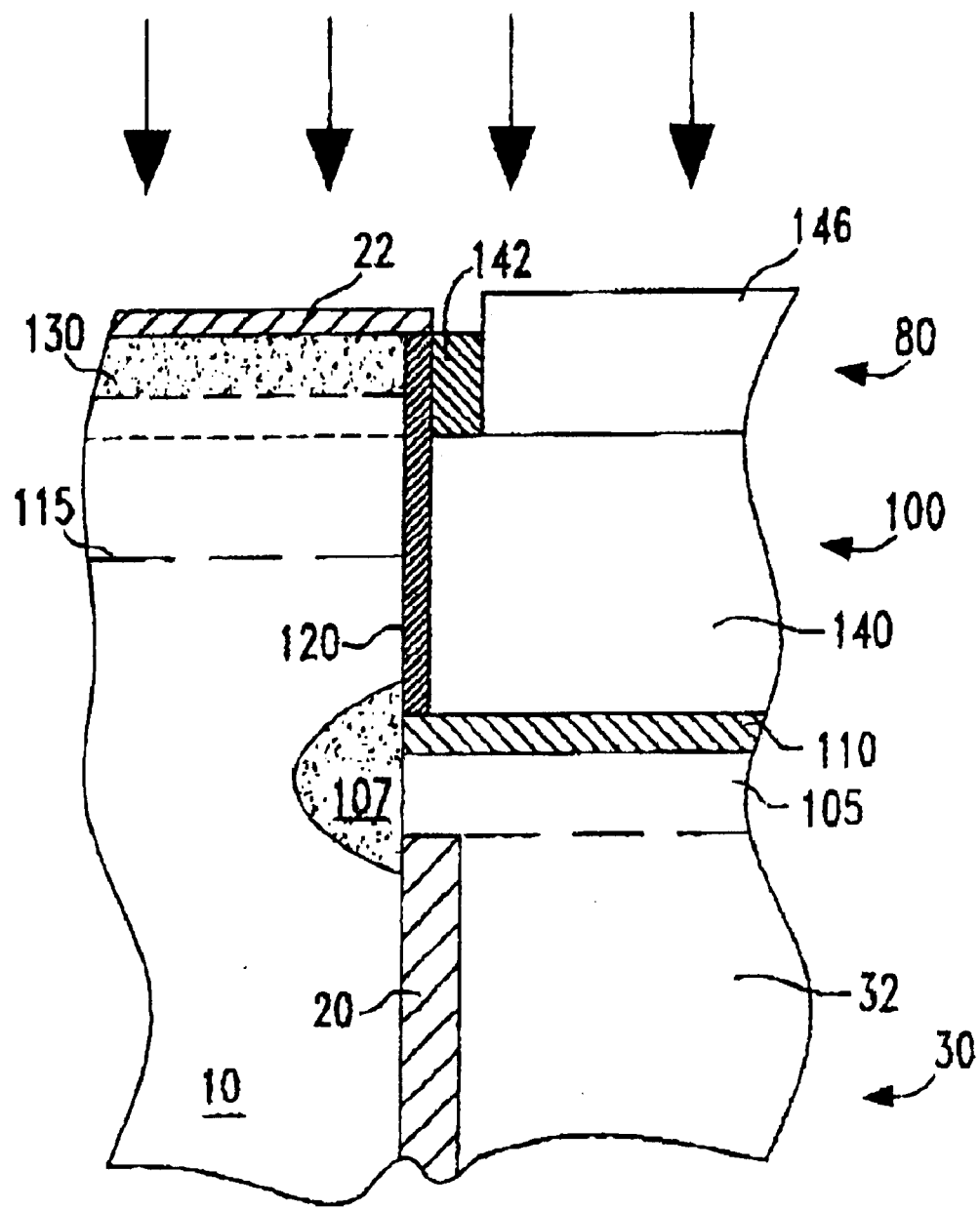
FIG. 1 shows, in partially pictorial, partially schematic form, the formation of a vertical transistor according to a prior art method.
Figure 3B:
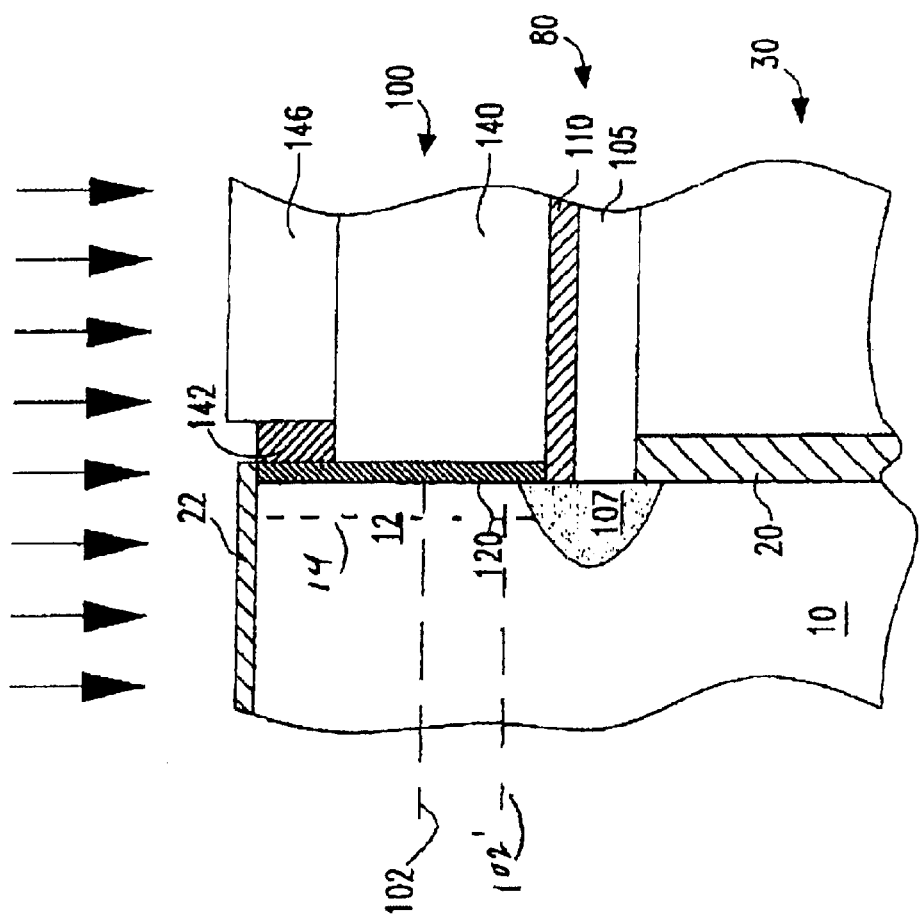
FIGS. 3A and 3B show a first embodiment of the invention.

Referring now to FIG. 3B, an N-channel transistor 100 is contained within a DRAM cell 80 and formed in a portion of p-type single-crystal silicon wafer 10. Deep trench capacitor 30 completes the cell. Structurally, the transistor components are the source, or upper electrode, 130 (an As-doped bitline diffusion of the DRAM array extending perpendicular to the plane of the paper, shown in FIG. 1 for convenience), polysilicon (poly) gate 140, with gate dielectric 120 separating the vertical gate 140 from the bulk silicon 10 and drain, or lower electrode, 107. Pad layer 22 (oxide SiO2 and/or nitride Si3N4) protects the silicon surface during these preliminary steps. Additionally, a poly stud 146 extends vertically to make contact with circuit interconnection elements. Stud 146 is isolated from source 130 by dielectric 142, illustratively nitride.

Drain 107, doped N+ and formed by diffusion of As dopant out from a layer of doped poly 105, provides a path for electrons to follow through buried strap 105 and into the center electrode 32 of deep trench capacitor 30. A layer of dielectric 110 (oxide) isolates gate 140 from buried strap 105. In operation, electrons will flow from source 130 along a channel denoted with numeral 12 in the transistor body region opposite gate 140 (the channel being separated from the gate by oxide gate dielectric 120) into drain 107. Illustratively, the vertical channel has a length of about 150–200 nm in current technology (110 nm ground rule). For purposes of the attached claims, gate 140 and the body will be referred to as being above lower electrode 107, even though they are more or less offset laterally, since they are closer to the substrate surface and part of the transistor.

The inventors have found unexpectedly that it is possible to reduce body effects on the threshold voltage of the transistor by changing the horizontal distribution of the implant that sets the threshold voltage of the transistors. In the prior art, the implant energy was selected to position the peak of the ion distribution vertically about midway in the channel. The implant was uniform horizontally (laterally), therefore producing an ion distribution in the transistor body that was uniform horizontally (laterally). The inventors have found that it is desirable to grade the channel doping of vertical MOSFETs laterally such that the peak of the threshold implant concentration is moved toward the gate oxide interface and the remainder of the transistor body (the part that contributes to the substrate bias effect) has a considerably lower ion concentration. Using a separate, angled shallower Vt tailoring implant allows the implant near the gate oxide to be set as needed to control the threshold voltage, leaving the concentration in the remainder of the body 10 a free parameter to reduce the body effect.

Optionally, ion channel doping in the vicinity of source 130 can be higher than in the prior art and doping concentration near drain diffusion 107 can be reduced compared to that in the prior art to reduce short channel effects. The channel doping in the prior art attempted to make the ion distribution substantially uniform horizontally and also placed the peak of the implant that determines the threshold voltage (Vt) of the device mid-way between source and drain. In the preferred embodiment we describe the solution of making the device doping laterally nonuniform to improve the P-well bias effect. Use of the laterally nonuniform channel doping profile in a vertical MOSFET is an unexpected result that was discovered through the use of device simulation and confirmed by experiment.

Preferred Embodiment

Figure 2:
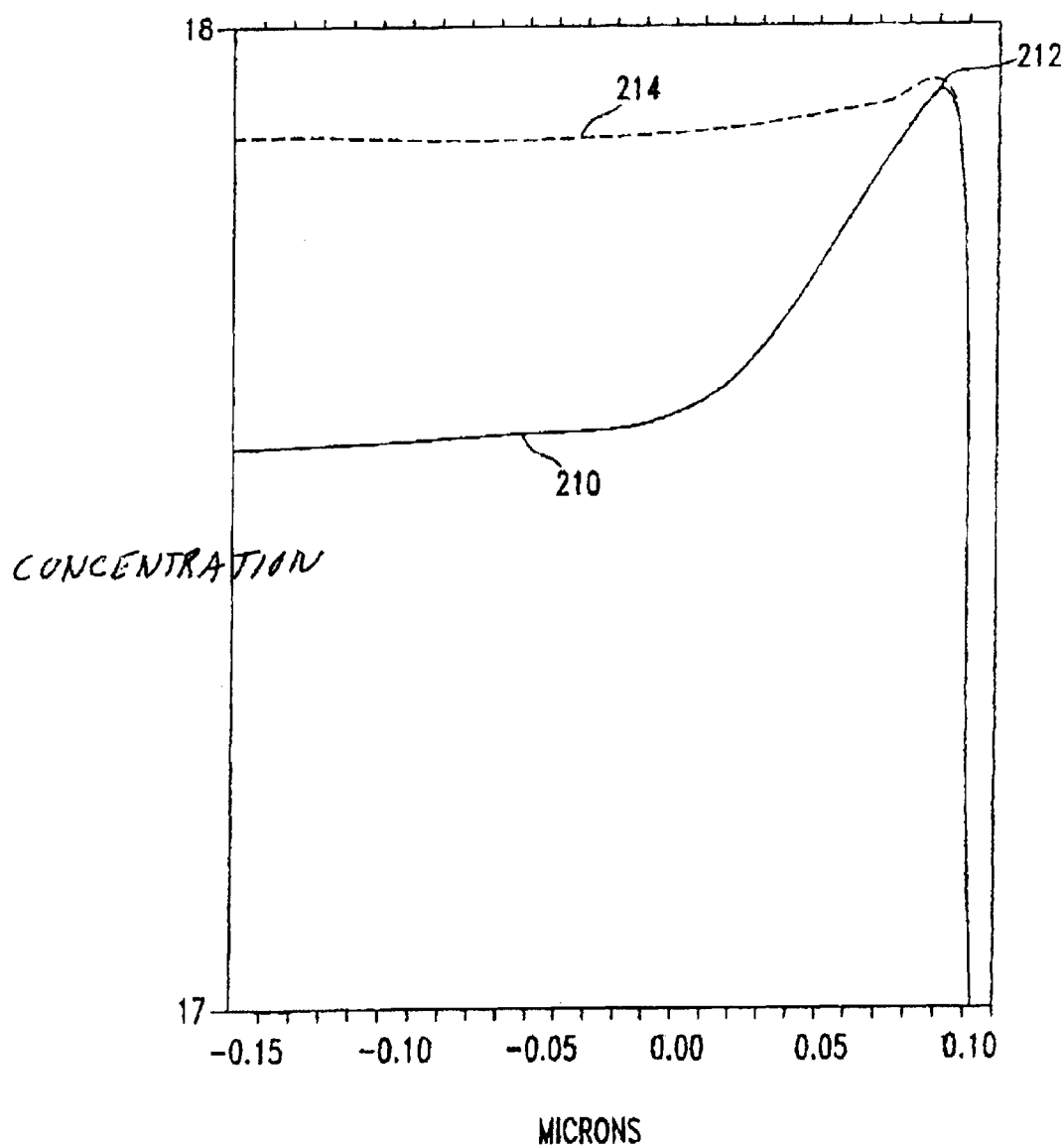
FIG. 2 shows a curve illustrating the Vt ion concentration as a function of distance from the gate dielectric according to the invention and according to the prior art.

Transistors constructed according to the invention control the body effect while preserving the other critical device characteristics (e.g. constrained doping at the buried strap diffusion, sub-Vt swing and drain induced barrier lowering (DIBL)). The solution involves implanting the Vt implant from the side (through the deep trench opening) and reducing its lateral extension, such that its peak lies substantially on the channel, as shown in FIG. 2. There, curve 210 represents the concentration taken along line 102 in FIG. 3B. It can readily be seen that the peak of the curve, 210, is essentially at the body-gate interface i.e. is essentially superimposed on the channel, overlapping the channel by 20 nm–70 nm. The term "peak" as used herein means the portion of curve 210 that sharply rises above the plateau on the left of the Figure, not just the maximum value of the distribution. The term "lateral peak" is used to highlight that the distribution is viewed along a lateral cross section. With this configuration, the Vt implant affects the threshold of the device, as it is designed to do, while having the minimum effect on the body. As can readily be seen, curve 210 falls sharply as the distance from the gate oxide interface increases, leveling off at a concentration selected to be between $1\times10^{17}$–$3\times10^{17}$ ions per cubic centimeter which is set by the vertical implant. This concentration is chosen such that the P-well bias sensitivity is low. In FIG. 2, curve 210 is the result of both the side implant and the uniform implant. Optionally, the vertical implant may be omitted, thereby minimizing the concentration to a low value determined by the angled implant. Curve 214 shows a typical prior art profile, having substantially the same concentration at a given depth in the body.

In a particular design for a DRAM having a minimum ground rule of about 110 nm the Boron Vt tailor implant was made at an angle of about 7°–20° from the vertical, followed by a laterally uniform low dose implant. Unexpectedly, the body effects are much improved from this change in the depth of the Vt tailor implant. The nonuniformity of the channel profile allows control of the Vt to be partially decoupled from the sensitivity to dopant concentration in the body. The value of Vt is primarily determined by the bulk of the ion distribution in the channel (i.e. close to the gate oxide).

Embodiment 1

Figure 3A:
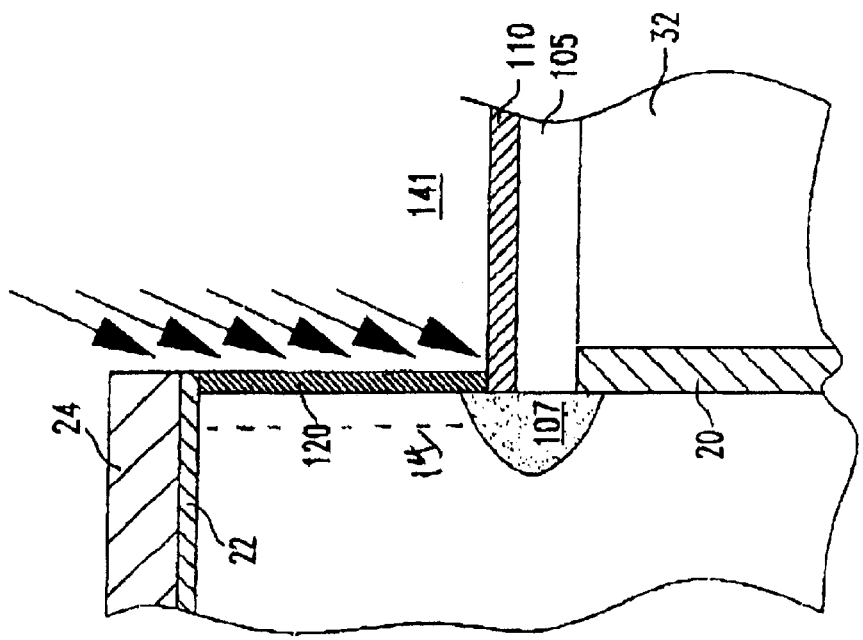

The transistor structure as built up to the time of the shallow Vt implant is seen in FIG. 3A. The deep trench poly 32, collar 20, buried strap polysilicon 105, trench top oxide (TTO) 110 and gate oxide 120 are all done by this time in conventional fashion well known to those skilled in the art. With the upper part of the transistor aperture 141 empty, the Vt tailor implant was made at an angle of between 7°–20°, at an energy of 10 keV, peaking at a nominal 0.02 μm from the oxide interface, the extent of the implant being indicated schematically by vertical line 14. The dose was a nominal $2\times10^{13}/cm^2$. In the example illustrated, the aperture 141 above the insulator 110 was 350 nm deep and 150 nm wide (as defined by the deep trench opening), permitting the Vt implant to penetrate to the drain. In FIG. 3B, poly gate 140, poly stud 146 and nitride spacer 142 to make isolated contact to the cell transistor have been formed at any convenient time after the Vt implant. The laterally uniform body implant is shown as being performed after these transistor elements have been formed.

For convenience in illustration, the laterally uniform body implant is shown as taking place after the formation of the gate, stud and isolation. but that is not required in general. Optionally, the body implant is a laterally uniform dose of $0-1\times10^{13}/cm^2$ of Boron at 35–40 keV and could be performed before the Vt implant, immediately after the Vt implant, or at a later time as indicated in FIG. 3B. Additional process steps include completing the device including anneals that are typical and conventional along with the middle-of-the-line and back-end-of-line steps (which are also conventional) and will be referred to collectively as "completing the circuit". In FIG. 3B, line 102 indicates schematically the vertical position of an upper lateral peak in the threshold dopant distribution, Line 102' indicates a corresponding lower lateral peak in the threshold dopant distribution. The benefits of this arrangement are discussed below.

Those skilled in the art would have thought, since the Vt implant is rapidly-diffusing boron, that the boron would diffuse throughout the well and not preserve the shallow concentration peak that is initially formed by the angled implant. Unexpectedly, the result of processing according to the invention was that the boron Vt peak did not spread out under conventional anneals having a thermal budget typical in DRAM processing (which can include the isolation sidewall oxidations, the trench fill anneals, and support device anneals). In the illustrative example, a change of the threshold voltage from 345 mV to 175 mV for a P-Well bias swing from –0.5V to –2V and a change from 154 mV to 85 mV for a swing from –0.5V to –1V was produced by use of a process according to the invention.

Embodiment 2

Figure 4:
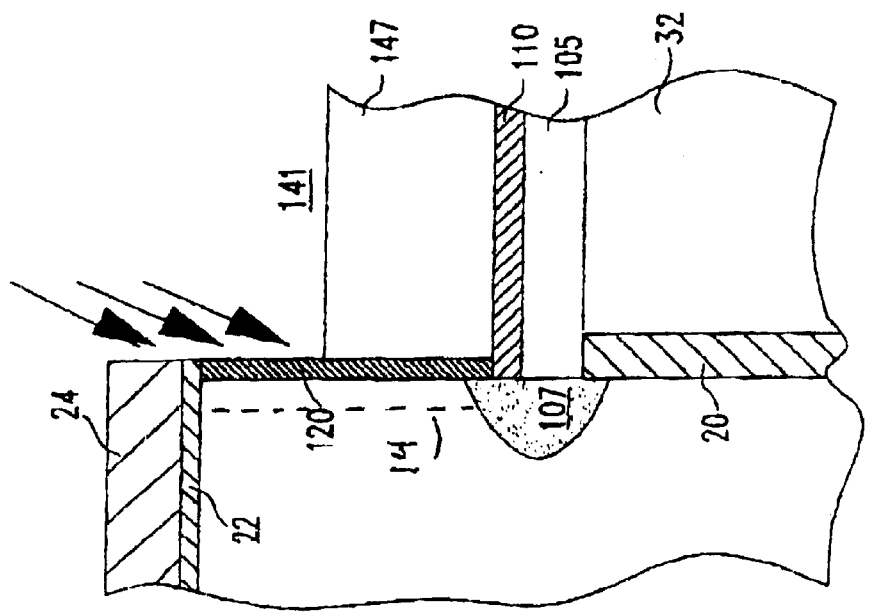
FIG. 4 shows an alternate embodiment of the invention.

In this embodiment the angled threshold implant is done only in the upper portion of the channel toward source 130. As a consequence, the region of the channel near drain 107 has a lower concentration of dopant than the portion toward the source so that there is less leakage at the channel-drain junction and so that hot-electron effects are reduced similarly to the effect of a low-dose drain in horizontal transistors. Referring to FIG. 4, this result is effected by filling aperture 141 with a dummy poly fill 147 and recessing the fill to a desired depth, leaving dummy poly plug 147. Since the location of the top of plug 147 is not critical, the recess etch can be a timed etch.

In the prior art, formation of drain 107 by outdiffusion from buried strap 105 did not permit the control of dopant gradient to form a low-doped drain with the same degree of precision that has been developed for horizontal planar transistors. In this embodiment of the invention, the peak of the Vt ion distribution being shifted upward, the tail in the vicinity of the buried strap consequently has a lower concentration than in the prior art, so that hot-electron effects are reduced and an additional degree of freedom to establish the equivalent of a LDD area at the drain has been provided by the invention.

Embodiment 3

Figure 5:
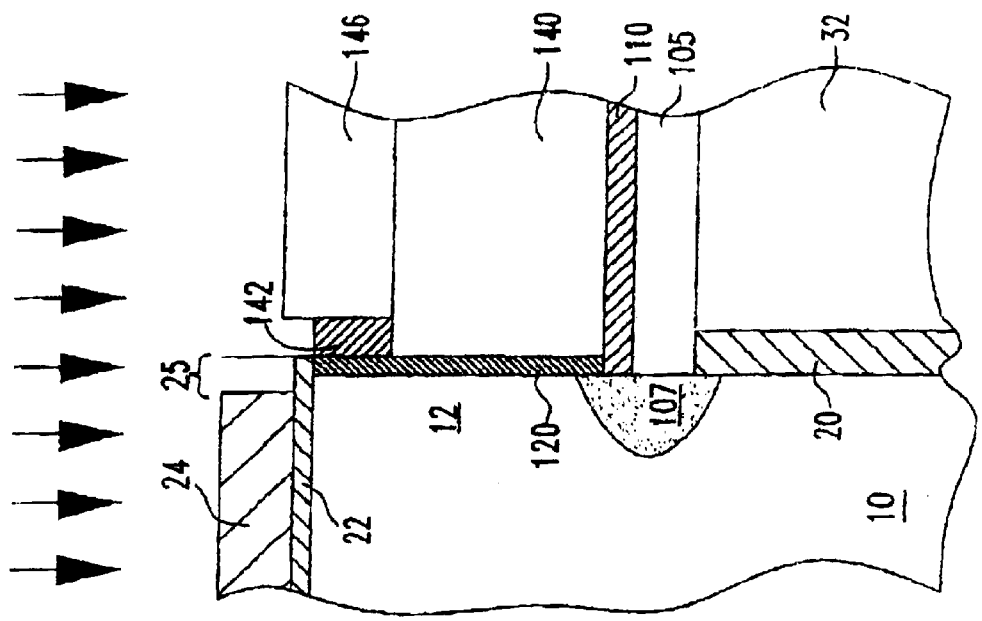
FIG. 5 shows another alternate embodiment of the invention.

Referring now to FIG. 5, another embodiment is illustrated in which the transistor structure is completed before the Vt and body doping steps. On the right of the Figure, gate 140, poly stud 146 and isolation member 142 have all been formed. In this embodiment, nitride pad layer 24 is made sufficiently thick (130–170 nm) to block the Vt implant. Pad layer 24 is pulled back by about 20 nm using a wet etch to expose a channel region denoted by bracket 25 that extends perpendicular to the paper throughout the active region, and the Vt implant is performed vertically. The remainder of pad layer 24 is then stripped in a conventional wet etch and the laterally uniform body implant is performed to provide the p-well doping. Optionally the vertical implant is not done. Other p-well implants and the As implant for the bitline may be performed at this time (or at any other convenient time).

Those skilled in the art will readily appreciate that other embodiments of the invention may be made, with different implant energies dependent on the vertical dimensions of the transistors. Additionally, the invention is not confined to DRAMS, nor to silicon substrates. The silicon material 10 need not be in the form of a thin wafer, but may be one layer of a stack of semiconductor layers that contain a set of vertical transistors disposed in a set of layers disposed vertically above one another. Other circuits having vertical transistors may benefit from the invention, which may be practiced in Si—Ge, polysilicon or other semiconductor substrates. Other materials may be used for dielectrics and for gates according to the preference of the designer.

We claim:

1. A vertical transistor formed in well disposed in a semiconductor substrate, said well having a substantially uniform lateral well concentration of implanted well dopant parallel to a surface of said semiconductor, comprising:
   a upper transistor electrode formed in a top level of said transistor;
   a lower transistor electrode formed in a lower level of said transistor;
   a gate dielectric extending downwardly from said upper transistor electrode toward said lower transistor electrode and abutting a transistor body formed in said semiconductor substrate;
   a threshold dopant distribution of dopant disposed in said transistor body, said threshold dopant distribution having a peak adjacent said gate dielectric and a lower value of threshold dopant concentration less than said lateral well concentration away from said gate dielectric; and
   a transistor gate disposed adjacent said gate dielectric on a side opposite said transistor body.

2. A transistor according to claim 1, in which said threshold dopant distribution has a first lateral peak value in an upper portion of said transistor body and a second lateral peak value lower than said first lateral peak value in a lower portion of said body, whereby said concentration value of said threshold dopant distribution in said channel has a minimum value near said lower transistor electrode.

3. A transistor according to claim 2, in which said lateral peak value has a magnitude such that said transistor has a design threshold voltage.

4. A transistor according to claim 1, in which said threshold dopant distribution has a first lateral peak value in said peak, said first lateral peak value having a magnitude such that said transistor has a design threshold voltage.

5. A DRAM having an array of memory cells comprising a vertical transistor disposed above and connected to a capacitor, said vertical transistor being formed in a well disposed in a semiconductor substrate, said well having a substantially uniform lateral well concentration of implanted well dopant parallel to a surface of said semiconductor, said vertical transistor extending downwardly from an upper transistor electrode toward a capacitor electrode and comprising:
   a lower transistor electrode formed in a lower level of said transistor and connected to said capacitor; a gate dielectric extending downwardly from said upper transistor electrode toward said lower transistor electrode and abutting a transistor body formed in said semiconductor substrate;
   a threshold dopant distribution of dopant disposed in said transistor body, said threshold dopant distribution having a peak adjacent said gate dielectric and a lower value of threshold dopant concentration less than said lateral well concentration away from said gate dielectric; and
   a transistor gate disposed adjacent said gate dielectric on a side opposite said transistor body.

6. A DRAM according to claim 5, in which said threshold dopant distribution has a first lateral peak value in an upper portion of said transistor body and a second lateral peak value lower than said first lateral peak value in a lower portion of said body, whereby said concentration value of said threshold dopant distribution in said channel has a minimum value near said lower transistor electrode.

* * * * *